United States Patent
King

[11] Patent Number: 5,892,358
[45] Date of Patent: Apr. 6, 1999

[54] MR IMAGING METHOD USING ANISOTROPIC SPIRAL SCANNING TRAJECTORY

[75] Inventor: Kevin Franklin King, New Berlin, Wis.

[73] Assignee: General Electric Company, Milwaukee, Wis.

[21] Appl. No.: 826,923

[22] Filed: Apr. 8, 1997

[51] Int. Cl.[6] .................................................... G01V 3/00
[52] U.S. Cl. .......................................... 324/309; 324/307
[58] Field of Search .................................. 324/307, 309, 324/312, 314, 318, 300

[56] References Cited

U.S. PATENT DOCUMENTS

| | | | |
|---|---|---|---|
| 5,270,653 | 12/1993 | Pauly | 324/309 |
| 5,402,067 | 3/1995 | Pauly et al. | 324/307 |
| 5,532,595 | 7/1996 | Lampman et al. | 324/309 |

*Primary Examiner*—Louis Arana
*Attorney, Agent, or Firm*—James O. Skarsten; Christian G. Cabou; Phyllis Y. Price

[57] ABSTRACT

A spiral scan MR imaging method is provided for acquiring an image of a specified section taken through an object, wherein the section has a generally elongated shape. Thus, first and second dimensions of the section, measured along first and second mutually orthogonal section reference axes, respectively, have a relationship such that the first dimension is substantially greater than the second dimension. The method includes the step of applying spatially selective RF excitation to an imaging volume containing the object, in order to select a slice which includes the specified section. The method further includes the step of generating a read-out gradient defining a selected anisotropic spiral trajectory in an associated k-space domain having first and second mutually orthogonal k-space reference axes, which respectively correspond to the first and second section reference axes. A set of data samples is acquired during an acquisition period, each of the data samples corresponding to a sampling point on the anisotropic spiral trajectory, the spacing between adjacent sampling points measured along the first k-space axis being substantially less than the spacing therebetween measured along the second k-space axis.

11 Claims, 6 Drawing Sheets

MR IMAGING METHOD USING ANISOTROPIC SPIRAL SCANNING TRAJECTORY

BACKGROUND OF THE INVENTION

The invention disclosed and claimed herein generally pertains to an improved spiral scanning technique for magnetic resonance (MR) imaging. More particularly, the invention pertains to such technique wherein image quality is improved by means of an anisotropic scan trajectory, and an anisotropic field of view (FOV).

As is well known, spiral scanning is an MR imaging method which has been used to achieve much shorter scan times than can be achieved with conventional MR techniques, for a wide range of applications. The basis for such method is a spiral imaging sequence, where data from k-space is acquired in a spiral rather than the more conventional recti-linear trajectory. In a spiral acquisition, the gradients in the logical X- and Y-axes start from zero and increase in amplitude in a quasi-periodic fashion. This has the effect of a trajectory that starts from the center of k-space and spirals out to some maximum value. Such technique is described, for example, in commonly assigned U.S. Pat. No. 5,604,435, issued Feb. 18, 1997 to Thomas K. Foo and Kevin F. King, the inventor herein. Such technique is further described in other references cited in such patent.

In MR imaging generally, the product of scan time and read-out time is proportional to the product of spatial resolution and field of view. Accordingly, the substantially reduced scan time achieved by the spiral scanning technique requires a longer read-out time, if equivalent spatial resolution is to be maintained. Unfortunately, the spins of off-resonant frequencies tend to cause blurring in a spiral scan image, in proportional relationship to read-out time. In some circumstances, the degree of blurring in a spiral scan image resulting from the increased read-out time is quite intolerable.

For a conventional spiral scan, wherein the time required to reach maximum gradient amplitude is negligible, the read-out time $T_r$ is approximated by the expression $T_r \approx \pi D^2/4 MBr^2$. In such expression, D is the FOV diameter, M is the number of spiral interleaves, B is the band width of the associated MR system receiver, and r is resolution element size. From such expression, the effects of alternative measures to decrease read-out time $T_r$, in order to reduce off-resonant blurring, will be readily apparent. If $T_r$ is decreased either by decreasing D or increasing r, field of view or spatial resolution, respectively, will be reduced. If $T_r$ is reduced by increasing M, i.e., by using more interleaves, the scan time will be increased. If $T_r$ is decreased by using higher receiver band width, the signal to noise ratio (SNR) of the MR system will be decreased. Each of these results is generally undesirable. Accordingly, the off-resonant blurring effects encountered in spiral scanning have, in the past, tended to place a limit on the maximum spatial resolution and minimum scan time which could be achieved with such technique.

SUMMARY OF THE INVENTION

In accordance with the invention, it has been recognized that a cross-section taken through human body structure is frequently elongated or of generally elliptical shape. In such event, a measurement of the section along one direction will be substantially greater than a measurement along a second orthogonal direction. Accordingly, if an MR image of the section is acquired by means of spiral scanning, the field of view can be reduced along the direction of the smaller measurement, without encountering aliasing. At the same time, spatial resolution will be significantly increased in such direction without increasing either read-out time Tr or image blurring. Alternatively, spatial resolution can be kept substantially constant, while decreasing read-out time to reduce blurring. Reduced FOV is usefully achieved by implementing an anisotropic spiral scan trajectory, i.e., a spiral trajectory wherein data points on the trajectory have different spacings along two orthogonal axes, as described hereinafter in further detail.

The invention is generally directed to a spiral scan M imaging method for acquiring an image of a specified section taken through an object, wherein the section has a generally elongated shape. That is, first and second dimensions of the section, measured along first and second mutually orthogonal section reference axes, respectively, have a relationship such that the first dimension is substantially greater than the second dimension. The method includes the step of applying spatially selective RF excitation to an imaging volume containing at least a portion of the object, in order to select an object slice which includes the specified section. The method further includes the step of generating a read-out gradient wave-form with respect to the slice during an acquisition period, wherein the read-out gradient defines a selected anisotropic spiral trajectory in an associated k-space domain having first and second mutually orthogonal k-space reference axes, which respectively correspond to the first and second section reference axes. A set of data samples is acquired during the acquisition period, each of the data samples corresponding to a sampling point on the anisotropic spiral trajectory, the spacing between adjacent sampling points measured along the first k-space reference axis being substantially less than the spacing therebetween measured along the second k-space reference axis. The acquired data samples are selectively processed to provide an image of the specified section.

Each point on the anisotropic spiral trajectory has an associated polar angle. Preferably, the gradient wave-form is generated to provide an associated field of view which varies as a specified function of the polar angle. In one embodiment, the specified function of the polar angle comprises the spacing between adjacent turns of the anisotropic spiral trajectory. In a second embodiment, the specified function comprises the amplitude of the gradient wave-form.

OBJECTS OF THE INVENTION

An object of the invention is to provide a spiral scan MR imaging method which can be employed to improve spatial resolution without increasing read-out time or blurring, or alternatively to reduce read-out time and blurring without degrading spatial resolution.

Another object is to provide an imaging method of the above type having an associated non-circular or anisotropic FOV.

Another object is to provide a method of the above type for use with an elliptical or elongated subject of imaging, i.e., a subject having a dimension in one direction which is substantially less than a dimension in a second orthogonal direction.

These and other objects of the invention will become more readily apparent from the ensuing specification, taken together with the accompanying drawings.

DETAILED DESCRIPTION OF THE PREFERRED EMBODIMENT

Spiral scanning has previously been described, such as in the references cited above, as an alternative method for the acquisition of k-space data that is necessary to generate an image. Spiral scanning techniques of the prior art sample data in k-space along a spiral trajectory starting from the center of k-space and ending at some k-space edge, the position of which is determined by the image spatial resolution desired.

Figure 1:
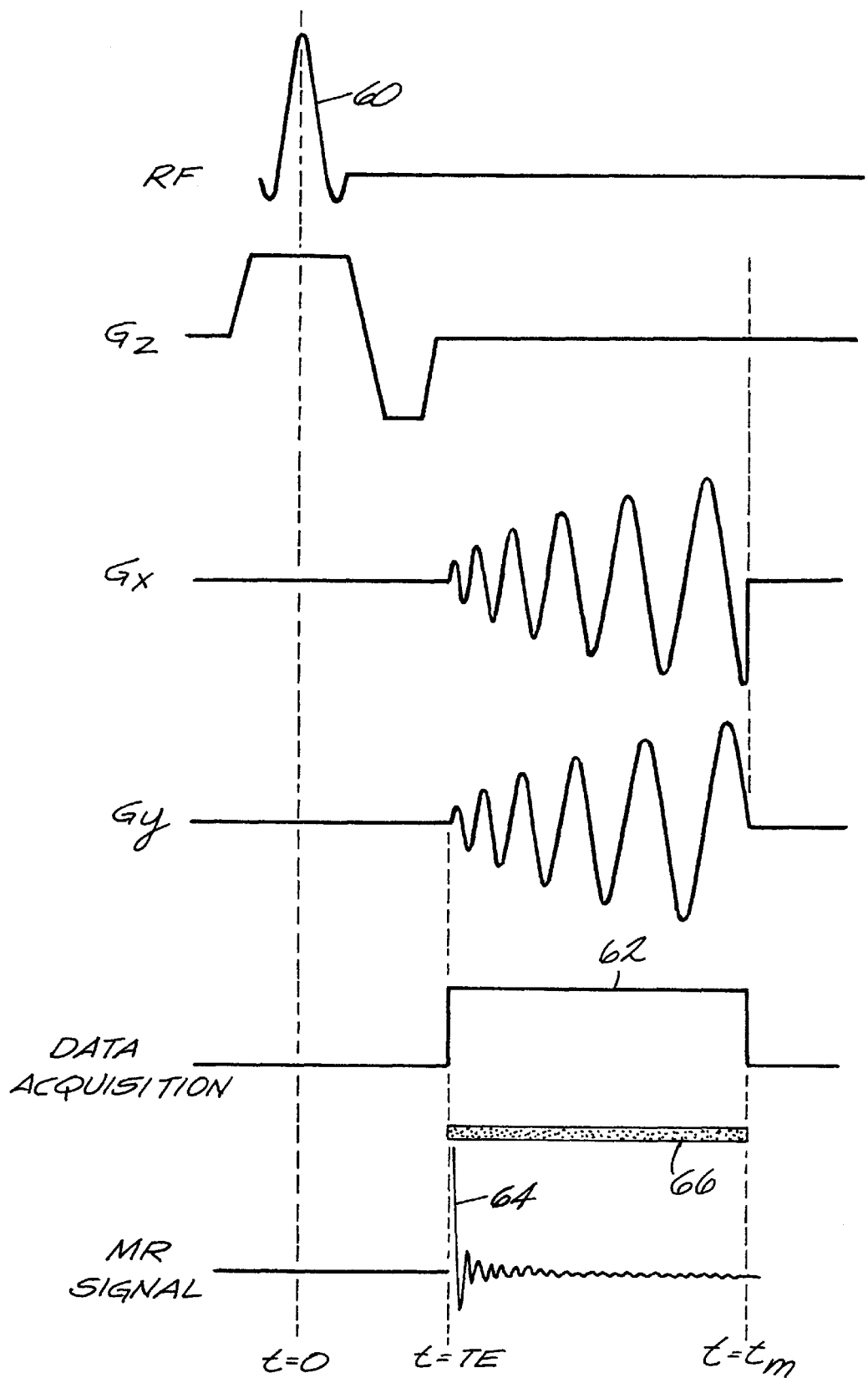
FIG. 1 shows a generalized set of wave-forms for a spiral scan MR sequence.

Referring to FIG. 1, there is shown a set of waveforms for a spiral scan imaging sequence which comprises a single slice selective RF excitation pulse 60 and logical x,y, and z-gradient waveforms, labeled $G_x$, $G_y$, and $G_z$, respectively. Preferably, the RF excitation pulse is spectrally and spatially selective. FIG. 1 also shows a data acquisition period 62 and the MR signal 64 during such period.

Figure 2:
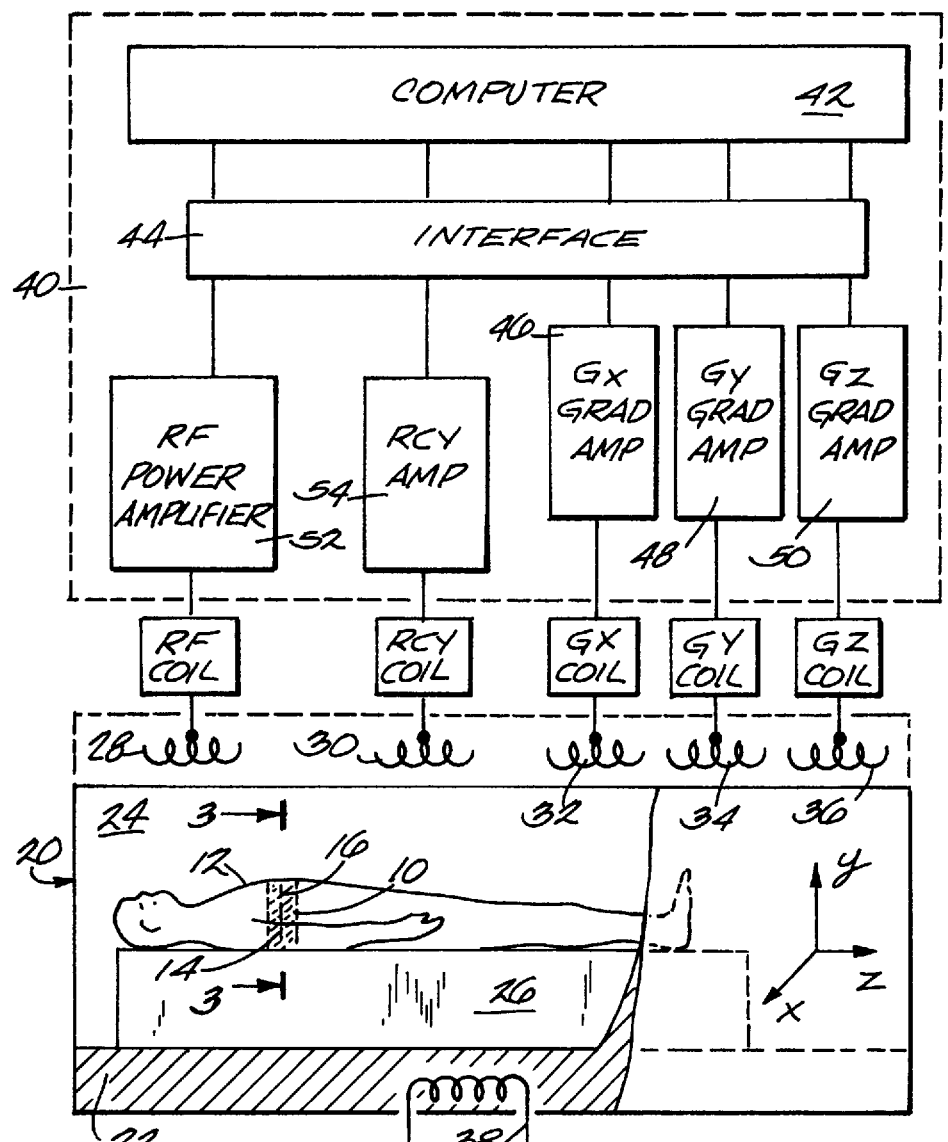
FIG. 2 is a diagram showing components of an MR imaging system for use in connection with embodiments of the invention.

The sequence shown in FIG. 1 commences with the slice selective RF excitation pulse that excites spins contained within a specified region 10 of a patient or any other subject 12 in an MR imaging study, as shown in FIG. 2. For purposes of illustration, FIG. 1 shows a z-gradient waveform $G_z$ that constitutes a slice selective waveform used in connection with the RF excitation pulse. This is a conventional slice elective RF excitation pulse and associated gradient waveform and can be easily substituted with a spectrally and spatially selective RF excitation pulses and its unique associated z-gradient waveforms. A planar section or slice 16, shown in FIG. 2 to be taken through body structure such as cardiac structure 14, is thereby selected for imaging, in accordance with well known conventional practice. The slice 16 is an axial slice, i.e., it is orthogonal to the Z-axis, and accordingly is in or is parallel to the X-Y plane. However, by selection of other gradient waveforms, in a manner well known in the art, a planar section having a different orientation could readily be selected. For example, in accordance with a technique known as oblique imaging, a plane could be selected which intersected the Z-axis in non-orthogonal relationship, i.e., which is tilted from the X-Y plane.

Figure 3:
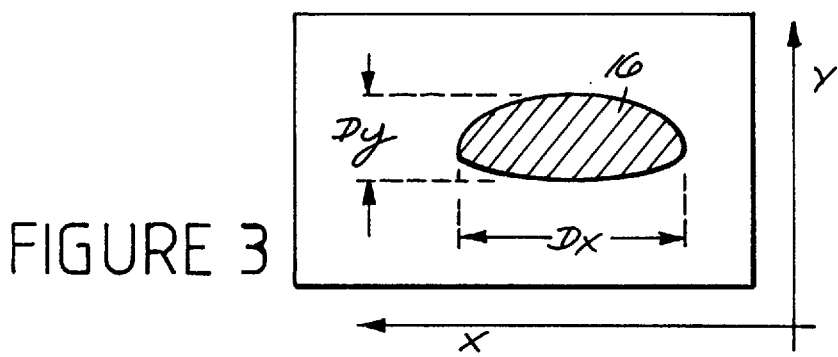
FIG. 3 is a sectional view taken along lines 3—3 of FIG. 2.

Referring to FIG. 3, there is shown the section or slice 16 of patient structure 14 being of elongated shape or form. That is, the dimension $D_x$ of slice 16, measured along the X-axis, is substantially greater than the dimension $D_y$ thereof, measured along the Y-axis.

Figure 4:
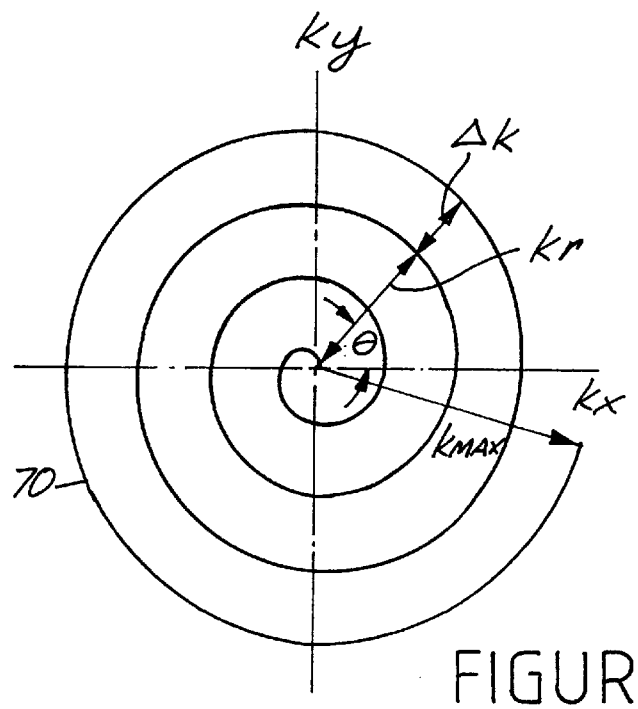
FIG. 4 is a diagram showing a generalized spiral scan trajectory in the k-space domain.

Referring further to FIG. 1, there is shown an echo 64 in the MR signal occurring at time TE after the peak of the RF excitation pulse 60. As is well known, a gradient echo occurs when the zeroth moments or area of all active gradients integrate to zero. At time TE data acquisition commences during the period 62, whereupon the MR signal is sampled to acquire a set of data points represented in FIG. 1 by block 66. Coincident with the start of the data acquisition period, oscillating readout waveforms $G_x$ and $G_y$, applied in the logical x and y directions respectively, are generated. The gradient waveforms are generated such that the integral of the gradient area in the respective x and y directions corresponds to the k-space position in the $k_x$ and $k_y$ directions. The amplitude and the value of the gradient waveforms in time are respectively chosen so that they combine to generate a spiral trajectory in k-space of selected shape, as described hereinafter. Usefully, data samples are acquired with constant linear velocity, that is, the data samples are acquired at constant intervals along the spiral trajectory. The trajectory 70, as shown in FIG. 4, is of conventional circular or isotropic shape. Such trajectory spirals outwards from the center of k-space, that is from $(k_r,\theta)=(0,0)$ in a polar coordinate system, until a maximum radius, $k_r=k_{max}$ is attained at time $t=t_m$.

FIG. 2 shows principal components of an MR imaging system 20, useful for practicing respective embodiments of the invention described hereinafter. System 20 includes a main magnet 22 provided with a bore 24, the MR subject 12 positioned therein on a support 26 for MR imaging of the structure 14, referred to above. MR system 20 further includes an RF excitation coil 28, a receive coil 30, $G_x$, $G_y$, and $G_x$ gradient coils 32, 34, and 36, respectively, and a static main magnet coil 38. All of the coils 28 and 32–38 are incorporated into magnet 22 so that when energized, they project the respective magnetic fields shown in FIG. 1 into bore 24, and more specifically into region 10 of the subject 12. Receive coil 30 is likewise incorporated into magnet 22, to detect or acquire MR data points or samples.

Referring further to FIG. 2, there is shown MR system 20 further comprising system electronics 40, which include a computer 42 interactively coupled to an interface 44. Components of MR system 20 further include gradient amplifiers 46, 48, and 50, which are each coupled to computer 42 through interface 44, and respectively energize the $G_x$, $G_y$, and $G_z$ gradient coils 32, 34, and 36. Thus computer 42, through gradient amplifiers 46 and 48, drives the $G_x$ and $G_y$ gradient coils to generate an oscillating read gradient which comprises the combined effects of gradient waveforms $G_x$ and $G_y$ after time TE, to perform spiral scanning. System electronics 40 further includes an RF power amplifier 52, coupled to energize RF excitation coil 28 to produce the RF pulse, and a receive amplifier 54, which amplifies respective MR data samples detected by receive coil 30, and couples them to computer 42.

As is well known, a single coil can be substituted for RF excitation coil 28 and receive coil 30. In such modification, a switching mechanism (not shown) is provided to alternately couple excitation amplifier 52 and receive amplifier 54 to such single coil. It is to be understood that system electronics 40 is likely to include other components which are not shown for purpose of simplification.

After the end of data acquisition, the computer 42 may be operated to selectively process the acquired data samples, to generate an image of structure 14, as viewed in the section or slice 16.

Referring again to FIG. 4, it is to be noted that sampling distances in k-space must generally be chosen to obey the Nyquist requirement, to avoid aliasing artifacts. The Nyquist requirement states that samples of a bandlimited function must occur at intervals smaller than one divided by the bandwidth. According to the central slice theorem, a spoke in k-space at polar angle θ is the Fourier transform of the object projection normal to the spoke. The Nyquist criterion therefore requires the maximum sample spacing along a spoke to be the inverse of the diameter of the projection at that angle. For a general spiral k-space trajectory 70, samples do not lie along spokes, but the Nyquist requirement may be generalized as defining the distance between adjacent turns of the spiral. For conventional spiral scanning, the alias-free FOV is circular with diameter D and the projection of this FOV therefore also has diameter D at any polar angle. If Δk is the distance between adjacent spiral turns, the Nyquist criterion is:

$$\Delta k \leq \frac{1}{D} .\qquad \text{Equation (1)}$$

FIG. 4 shows Δk for a single interleave spiral 70. For a multi-interleave spiral with M interleaves, Equation (1) is generalized to:

$$k(\theta + 2\pi) - k(\theta) = \frac{M}{D} \qquad \text{Equation (2)}$$

The Nyquist criterion for sampling in the time domain implies that the receiver bandwidth must match or exceed the frequency bandwidth of spins across the sample. The frequency bandwidth is determined by the imaging gradient and the width of the projection of the object normal to the direction of the gradient. For conventional spiral scans, the FOV is circular and the diameter of the projection is equal to the FOV diameter D. The Nyquist requirement is:

$$\frac{\gamma}{2\pi} GD \leq B. \qquad \text{Equation (3)}$$

where B is the full receiver bandwidth given by one divided by the sample time and G is the gradient amplitude. Typical conventional spiral gradient waveforms are frequency modulated sinusoids which start at zero amplitude and build up at a fixed slew rate $S_0$ until the maximum gradient amplitude $G_0$ is reached, where $G_0$ is chosen to satisfy Equation 3. For conventional spirals, $G_0$ is independent of the polar angle θ.

Spatial resolution is defined by the maximum radius reached in k-space, i.e., $k_{max}$ shown in FIG. 4. For conventional spirals, $k_{max}$ is approximately independent of the polar angle θ. The spatial resolution element size r is given by:

$$r = \frac{1}{2k_{max}} . \qquad \text{Equation (4)}$$

Figures 5, 6:
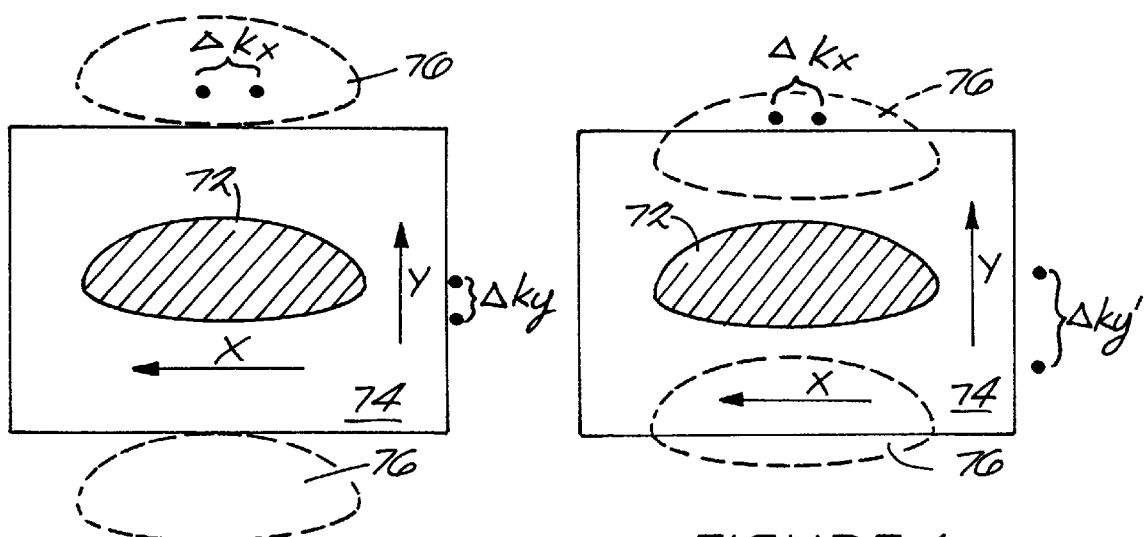
FIGS. 5–6 are simplified diagrams for illustrating field of view and the effects of alisasing.

As is known, FOV can be defined as the comparative area of a reconstructed image which is free from aliasing. To illustrate a basic principal of the invention, reference is made to FIG. 5, which shows the principal image 72 of an elongated object. The image 72, acquired by means of spiral scanning, lies within an FOV 74, in the X-Y plane. The longer dimension of image 72 extends along the X-axis, and the shorter dimension extends along the Y-axis. FIG. 5 further shows image replications 76, along the Y-axis, which do not extend into FOV 74. More importantly, the replications do not overlap the image 72. This indicates that $\Delta k_y$, the spacing between acquired data samples along the $k_y$-axis in k-space, is within the Nyquist criterion, specified above. The sample spacing $\Delta k_x$, along the $k_x$-axis is equal to $\Delta k_y$ in FIG. 5.

Referring to FIG. 6, there is again shown image 72 in FOV 74, with spacing $\Delta k_x$. However, the data sample spacing along the $k_y$ axis, $\Delta k^1_y$, is greater than spacing $\Delta k_x$ and $\Delta k_y$ of FIG. 5. Accordingly, the replications 76 extend into FOV 74, so that FOV 74 is reduced along the Y-axis. However, because image 72 is comparatively small along the Y-axis, the replications do not reach image 72. Thus, even though FOV 74 is reduced, aliasing does not affect image 72. It will be seen that FOV is anisotropic in FIG. 6, i.e., different in different directions, since the spacings $\Delta k_x$ and $\Delta k^1_y$ are different.

Figure 7:
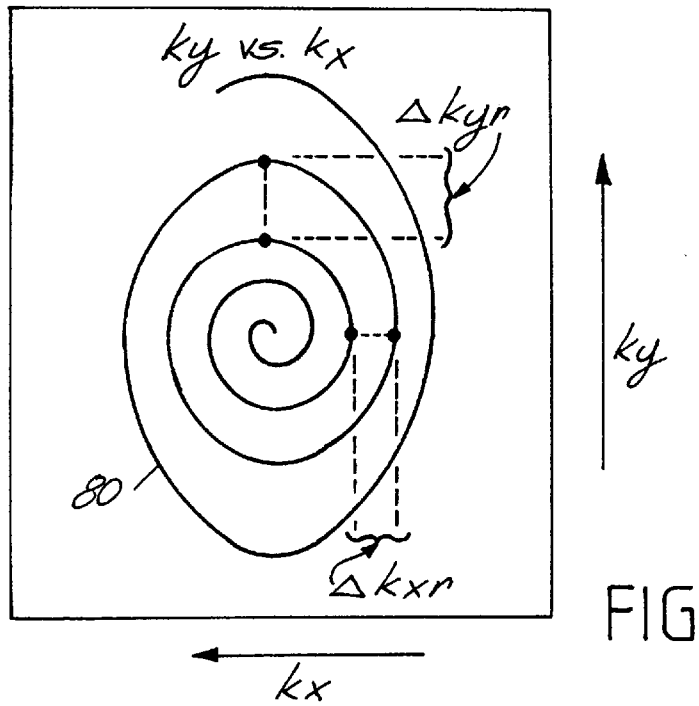
FIG. 7 shows the spiral scan trajectory in k-space for a first embodiment of the invention.

In accordance with the invention, it has been discovered that anisotropic FOV can be employed to improve spiral scan image quality. In one embodiment of the invention, which implements an anisotropic spiral trajectory 80 as depicted in FIG. 7, anisotropic spatial resolution is used. In such embodiment $k_{max}$ varies with polar angle θ. Because the spacing between adjacent spiral turns also increases if $k_{max}$ increases, anisotropic spatial resolution also requires anisotropic FOV. Equation (2) is generalized to $$k(\theta + 2\pi) - k(\theta) = \frac{M}{D_r(\theta)} . \qquad \text{Equation (7)}$$

where $D_r(\theta)$ is the FOV defined by the sampling distance between adjacent turns of the spiral. This technique could be used to increase spatial resolution in one direction of the image without additional readout time and additional blurring, provided that the object size is also smaller in that direction. This allows the use of a reduced FOV without alisasing, as described above. It is to be noted that the higher resolution occurs in the direction of the smaller FOV. Because this technique affects k-space sampling in the radial direction, it is usefully called anisotropic radial FOV.

Referring further to FIG. 7, there is shown anisotropic trajectory 80 having a spacing $\Delta k_{yr}$ between adjacent spiral turns, along a radius parallel to the $k_y$-axis. There is further shown a spacing $\Delta k_{xr}$ between adjacent turns, along a radius parallel to the $k_x$ axis, where $\Delta k_{yr}$ is greater than $\Delta k_{xr}$, causing the field of view to be smaller in the y direction than in the x direction.

To implement the spiral scan trajectory of FIG. 7, corresponding gradient waveforms $G_x$ and $G_y$ may be readily determined from Equation (7), and from the following relationships between the gradients and k-space positional components $k_x$ and $k_y$:

$$k_x = \gamma/2\pi \int G_x(t)dt \qquad \text{Equation (8)}$$

$$k_y = \gamma/2\pi \int G_y(t)dt \qquad \text{Equation (9)}$$

The FOV function $D_r(\theta)$, required for Equation (7), is derived hereinafter, for an object cross section of elliptical shape.

Figure 8:
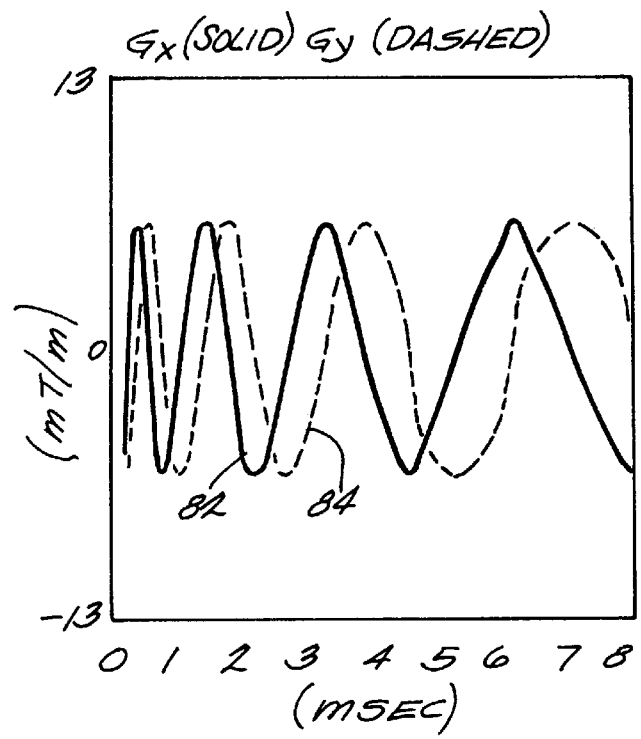
FIG. 8 shows $G_x$ and $G_y$ gradient waveforms for implementing the trajectory of FIG. 7.

Referring to FIG. 8, there are shown a gradient $G_x$, comprising waveform 82, and a gradient $G_y$, comprising waveform 84, computed in accordance with the above procedure. These $G_x$ and $G_y$ waveforms may be substituted in FIG. 1 for the respective $G_x$ and $G_y$ waveform portions during data acquisition period 62, to implement the trajectory of FIG. 7.

A second embodiment of the invention has an anisotropic spiral trajectory 90, as shown in FIG. 8. In accordance therewith, variation of the FOV is defined by the azimuthal sampling (i.e., samples 92 along a spiral arm 94) by allowing $G_0$ to vary with polar angle θ. For this technique, Equation (3) is generalized to:

$$G_0(\theta) = \frac{B}{\frac{\gamma}{2\pi} D_a(\theta)}$$ Equation (10)

where $D_a(\theta)$ is the angle-dependent azimuthal FOV. Decreasing $D_a(\theta)$ increases $G_0$ according to Equation (10) which decreases the time needed to reach $k_{max}$. As stated above, $T_r$ is proportional to $D^2$. If the object is smaller in one direction, the FOV can be reduced in that direction, allowing higher $G_0$ for part of the readout, and decreasing $T_r$ for a given spatial resolution or increasing spatial resolution for a given $T_r$. For this technique, spatial resolution is isotropic. Because this technique affects k-space sampling in the azimuthal direction, it is usefully called anisotropic azimuthal FOV.

Figure 9:
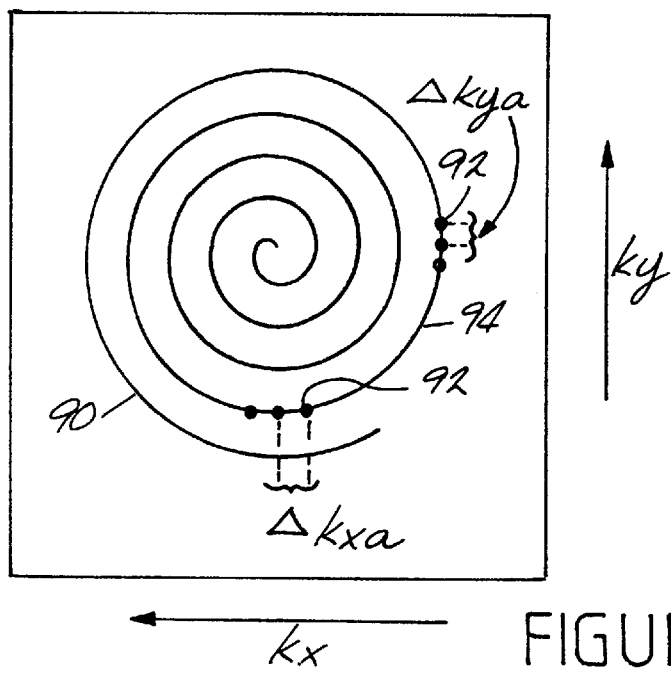
FIG. 9 shows the spiral scan trajectory in k-space for a second embodiment of the invention.

Referring further to spiral trajectory 90 in FIG. 9, it is seen that for the azimuthal case, the spacing $\Delta k_{xa}$ between samples 92 along the $k_x$-axis is greater than the spacing $k_{ya}$ therebetween along the $k_y$-axis, causing the field of view to be smaller in the x direction than in the y direction. In this embodiment the smaller dimension of the imaged section would be taken along the x-direction. To implement spiral trajectory 90, corresponding gradient waveforms $G_x$ and $G_y$ may be readily determined, from Equation (10) and from $D_a(\theta)$, derived hereinafter.

Figure 10:
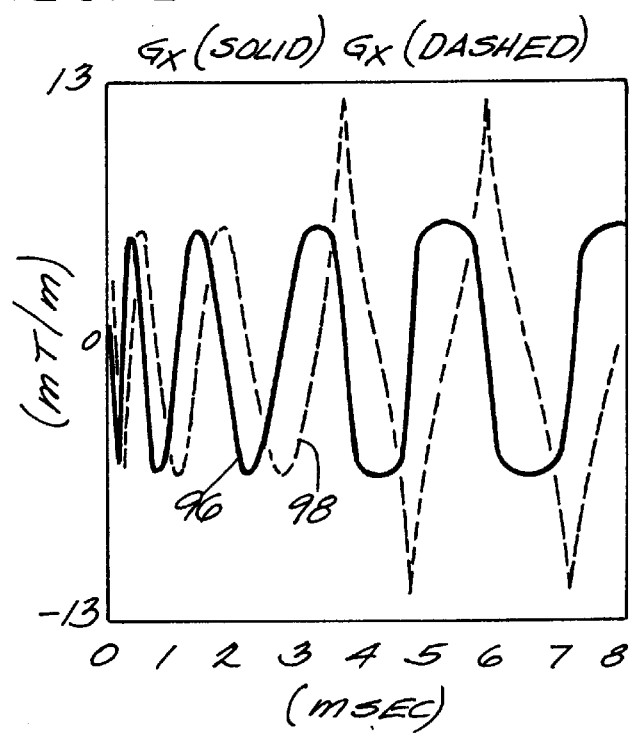
FIG. 10 shows $G_x$ and $G_y$ gradient waveforms for implementing the trajectory of FIG. 9.

Referring to FIG. 10, there are shown a gradient $G_x$, comprising waveform 98, and a gradient $G_y$, comprising waveform 96, computed in accordance with such procedure. These $G_x$ and $G_y$ waveforms may be substituted in FIG. 1 for the respective $G_x$ and $G_y$ waveform portions during data acquisition period 62, to implement the trajectory of FIG. 9.

Figure 11:
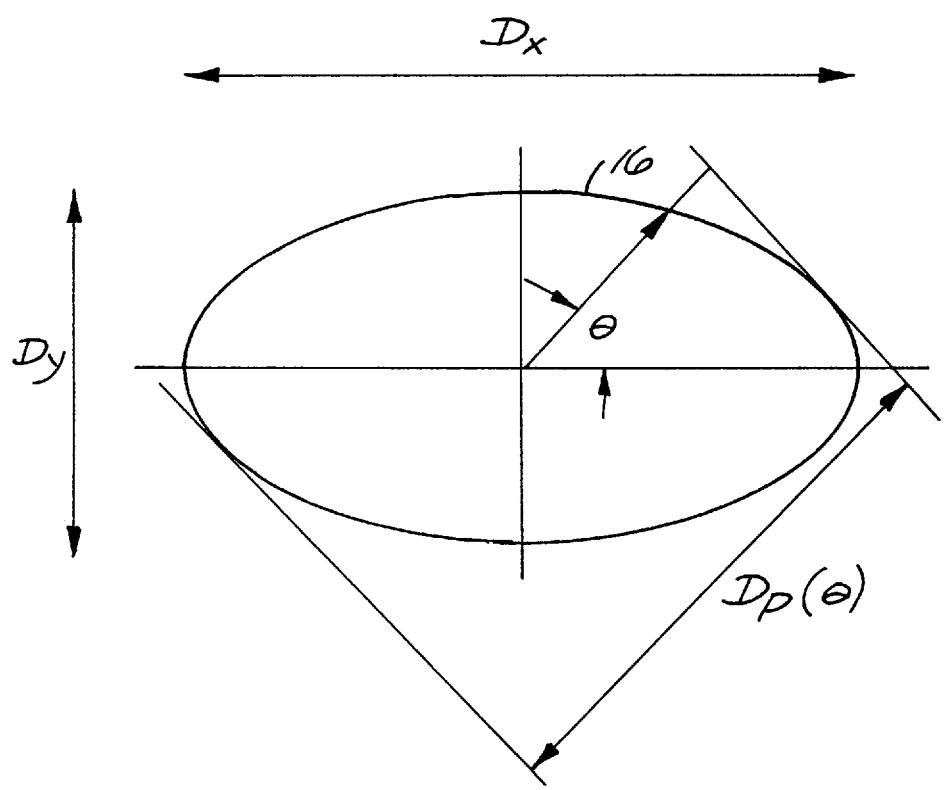
FIG. 11 is a diagram which is useful for illustrating a technique for determining field of view expressions for use in connection with the embodiments of FIGS. 7 and 8.

As stated above, human cross sections are often of elliptical shape. Accordingly, referring to FIG. 11, there is shown section or slice 16 of patient structure 14 assumed to be in the form of an ellipse, for use in determining radial and azimuthal FOV's $D_r(\theta)$ and $D_a(\theta)$. More particularly, $D_r(\theta)$ and $D_a(\theta)$ are derived from the width of the projection $D_p(\theta)$ of elliptical slice 16, which is given by:

$$D_p(\theta) = \sqrt{D_x^2 \cos^2\theta + D_y^2 \sin^2\theta}$$ Equation (11)

For the case of an ellipse, $D_r(\theta)$ and $D_a(\theta)$ are given by:

$$D_r(\theta) = D_p(\theta).$$ Equation (12)

and $$D_a(\theta) = D_p(\phi).$$ Equation (13)

where $\phi$ is the polar angle of the gradient, i.e., $$\phi = \tan^{-1} G_y/G_x.$$

The above techniques of radial and azimuthal FOV can be used separately, or can be combined to achieve certain additional benefits. Obviously, numerous other modifications and variations of the present invention are possible in light of the above teachings. It is therefore to be understood that within the scope of the disclosed concept, the invention may be practiced otherwise than as specifically described.

What is claimed is:

1. A method for providing an MR image of a specified section taken through an object, said section having first and second dimensions measured along first and second mutually orthogonal object reference axes, respectively, said second dimension being substantially smaller than said first dimension, said method comprising the steps of:

applying spatially selective RF excitation to an imaging volume containing at least a portion of said object to select a slice of said object which includes said section;

generating a read-out gradient wave-form with respect to said slice during an acquisition period, said read-out gradient defining a selectively anisotropic spiral trajectory in an associated k-space domain having first and second mutually orthogonal k-space reference axes respectively corresponding to said first and second object reference axes;

selecting a set of sampling point locations along said trajectory to provide a specified anisotropic field of view for said image, said field of view being reduced along a direction corresponding to said second object reference axis in comparison with said field of view along a direction corresponding to said first object reference axis, said sampling point locations being further selected to provide spacings between adjacent sampling points which respectively comply with the Nyquist criterion for said specified field of view;

acquiring a data sample at each of said sampling point locations during said acquisition period; and selectively processing said acquired data samples to construct said image of said section.

2. The method of claim 1 wherein:

the spacing between adjacent sampling points measured with respect to said first and second k-space axes is substantially different from each other.

3. The method of claim 2 wherein:

said specified function of said polar angle comprises the spacing between adjacent turns of said anisotropic spiral trajectory.

4. The method of claim 2 wherein:

the spacing between two adjacent turns of said anisotropic spiral trajectory, as measured along said second k-space axis corresponding to said second object axis, is greater than the spacing between the same two adjacent turns, as measured along said first k-space axis corresponding to said first object axis.

5. The method of claim 4 wherein:

said method provides a greater spatial resolution in the direction of said second k-space axis than in the direction of said first k-space axis.

6. The method of claim 2 wherein:

said specified function of said polar angle comprises the amplitude of said gradient wave form.

7. The method of claim 2 wherein:

the spacing between adjacent points on a specified turn of said anisotropic spiral trajectory, as measured along said second k-space axis, is greater than the spacing between adjacent points on the same specified turn, as measured along said first k-space axis.

8. The method of claim 1 wherein:

said constructed image has an anisotropic field of view, said field of view being reduced along the direction of said second object reference axis, in comparison with said field of view along said first object reference axis.

9. The method of claim 1 wherein:

each point on said anisotropic spiral trajectory has an associated polar angle; and said gradient wave form is generated to provide said field of view with a diameter which varies as a specified function of said polar angle.

10. The method of claim 9 wherein:

said specified function comprises the spacing between adjacent turns of said anisotropic spiral trajectory.

11. The method of claim 9 wherein:

said specified function comprises the amplitude of said gradient wave form.

\* \* \* \* \*